United States Patent [19]
Bakker et al.

[11] Patent Number: 4,878,102
[45] Date of Patent: Oct. 31, 1989

[54] CHARGE-COUPLED DEVICE

[75] Inventors: Jacobus G. C. Bakker; Leonard J. M. Esser, both of Eindhoven, Netherlands

[73] Assignee: U.S. Philips Corp., New York, N.Y.

[21] Appl. No.: 274,653

[22] Filed: Nov. 18, 1988

Related U.S. Application Data

[63] Continuation of Ser. No. 30,945, Mar. 26, 1987, abandoned.

[30] Foreign Application Priority Data

Mar. 27, 1986 [NL] Netherlands .......................... 8600786

[51] Int. Cl.⁴ ..................... H01L 29/78; H01L 27/14; H01L 29/06
[52] U.S. Cl. ......................................... 357/24; 357/30; 357/55; 357/56; 358/213.23; 358/213.26; 358/213.31; 377/61; 377/62; 377/63
[58] Field of Search ................. 357/24, 24 LR, 24 M, 357/56, 55, 30 G, 30 H; 358/213.23, 213.26, 213.31; 377/57, 61, 62, 63

[56] References Cited

U.S. PATENT DOCUMENTS 4,450,464  5/1984  Yamada .......................... 357/24 LR

FOREIGN PATENT DOCUMENTS 2412345  9/1975  Fed. Rep. of Germany .
3418778  11/1985  Fed. Rep. of Germany ........ 357/24 LR
52-36981  3/1977  Japan ................................... 357/24
1563341  3/1980  United Kingdom .

OTHER PUBLICATIONS

Kishida et al, "Amorphous-Silicon Charge-Coupled Devices", Applied Physics Letters, vol. 41, No. 12, Dec. 15, 1982.

Primary Examiner—Andrew J. James
Assistant Examiner—Ngan Van Ngo
Attorney, Agent, or Firm—William L. Botjer

[57] ABSTRACT

A charge-coupled device comprising two clock electrodes (4,5) on the two opposite sides of the charge transport channel (3) and which extend the entire length of the channel. Charge storage regions (6-9) are located zigzagwise on both sides of the channel, as a result of which during charge transport the charge is transferred from one side to the other. Due to the separation of the electrodes the parasitic capacitance between them is low, achieving low power dissipation. The electrodes are located in grooves at the sides of the channel, leaving the surface of the channel unobstructed. The device can therefore serve as an image sensor of high sensitivity.

9 Claims, 8 Drawing Sheets

CHARGE-COUPLED DEVICE

This is a continuation of application Ser. No. 030,945 filed Mar. 26, 1987, now abandoned.

BACKGROUND OF THE INVENTION

1. FIELD OF THE INVENTION

The invention relates to a charge-coupled device comprising a charge transport channel which is defined at a major surface of a semiconductor body and in which discrete charge packets can be transported in a number of steps from a first position to a second position under the influence of control voltages which are applied to two electrodes constituted by two strip-shaped conductors which extend parallel to each other at least over the distance between the first and the second position, charge storage regions being formed in the charge transport channel so that, when alternating control voltages are applied between the electrodes, charge packets can be transferred from the first to the second position via such charge storage regions situated alternately near the first and the second electrode.

DESCRIPTION OF THE RELATED ART

As is generally known, charge-coupled devices of conventional construction comprise a mostly large number of separate clock electrodes, which are consecutively arranged above the charge transport channel on the upper surface of the semiconductor body. When suitable voltages are applied to the clock electrodes, a potential profile of potential wells and potential barriers is formed in the charge transport channel. Electrical charge representing a given information can be stored in the potential wells. By variation of the voltages applied to the electrodes, the said potential profile and hence also the stored information can be displaced in the charge transport channel.

This electrode configuration has a number of disadvantages which under certain conditions can adversely affect a satisfactory operation of the device. As is known, the distance between two successive electrodes should be very small in order to prevent that in the spaces between the electrodes potential barriers (surface ccd's) or potential wells (bccd's) are formed, which impede the charge transfer. In order to guarantee that the potential in these regions is nevertheless well defined, mostly overlapping electrodes, for example made of a two-layer polycrystalline silicon structure, are used. Such a construction has the disadvantage that the parasitic capacitances between the electrodes or between the clock lines connected to the electrodes and hence also the currents to be supplied by the driving circuits (drivers) are large, more particularly at high frequencies.

Another disadvantage with the use of a conventional electrode configuration especially occurs in charge-coupled image sensor devices, in which the photosensitivity is considerably reduced by the presence of the electrodes on the surface onto which the radiation image to be sensed is projected. In order to reduce the loss of photosensitivity due to absorption (or reflection) by the electrodes, a number of different possible solutions have already been suggested. For example, it has been suggested to make the semiconductor body thinner via the back side and to project the radiation image to be trapped onto the back side. However, in practice, this method has proved to be too complicated to lead to a commercial success. Another solution consists in the use of transparent electrodes. The material particularly suitable for this purpose, i.e. doped polycrystalline silicon, has such an absorption characteristic that the photosensitivity of the sensor to short-wave light (blue) becomes much lower than for longwave light (red).

A charge-coupled device of the kind described in the opening paragraph is known inter alia from British Patent 1563341. This Patent discloses a charge-coupled device having a meandering channel which is defined by two oppositely arranged channel boundary zones, which have a comb-like structure comprising interdigitated fingers extending in the channel. The electrodes are constituted by two electrodes in the form of long strips which extend throughout the length of the charge-coupled device each above one half of the charge transport channel beside each other above the surface of the semiconductor body. In the charge transport channel, by means of doping, alternately charge storage regions and charge transfer regions are defined, which are situated alternately below the first and the second electrode, as a result of which the charge moves along a meandering line from the input to the output. This known device has a particularly simple electrode structure. However, the disadvantages described above inherent in conventional electrode structures are not or at least substantially not avoided in this known device.

SUMMARY OF THE INVENTION

The invention has for its object to provide a charge-coupled device of the kind described in the opening paragraph, in which the disadvantages described above are avoided at least in part.

According to the invention, a charge-coupled device of the kind described in the opening paragraph is characterized in that the first electrode, the charge transport channel and the second electrode form a multilayer structure, in which the charge transport channel is located between the first and the second electrode, which are provided on two opposite sides of the charge transport channel, while the charge transport channel, viewed in the direction from the first to the second electrode, has a thickness and a doping such that, when a voltage is applied between the first and the second electrode, an electrical field can be induced in the charge transport channel transverse to the thickness.

Therefore, the charge transport channel is clamped over the whole distance between the first and the second position between the first and the second electrode. In the case in which the electrodes form a rectifying junction with the charge transport channel, a three-layer structure is obtained. If the electrodes are separated be a dielectric layer from the charge transport channel, the electrodes, the dielectric layers and the charge transport channel constitute a five-layer structure. When, for example, in this last configuration one of the electrodes is replaced by an electrode forming a rectifying junction with the charge transport channel, a four-layer structure can be obtained.

Due to the fact that the electrodes are not arranged, as is usual, beside each other, but are arranged opposite to each other on opposite sides of the transport layer, the parasitic capacitance between the electrodes is fairly small.

An important embodiment is characterized in that, viewed in section transverse to the charge transport direction, the charge transport channel has a mesa-like configuration and in that the first and second electrodes are arranged on the upright walls of the mesa. The mesa may be obtained in a simple manner, for example, by etching grooves on either side of the charge transport channel when starting from a semiconductor body having a flat upper surface. The electrodes may be arranged in the grooves. In sensors such a construction has the advantage that the upper surface onto which the image to be trapped is projected is practically entirely free from electrodes, as a result of which a high photosensitivity can be obtained. Also in charge-coupled devices intended for other applications, such as, for example, in memories, the mesa configuration described herein can offer great advantages.

BRIEF DESCRIPTION OF THE DRAWINGS

The invention will be described more fully with reference to a few embodiments and the accompanying diagrammatic drawing, in which.

It should be noted that the Figures are schematic and are not driven to scale. In general, semiconductor regions of the same conductivity type are cross-hatched in the same direction.

DESCRIPTION OF THE PREFERRED EMBODIMENTS

Figure 1:
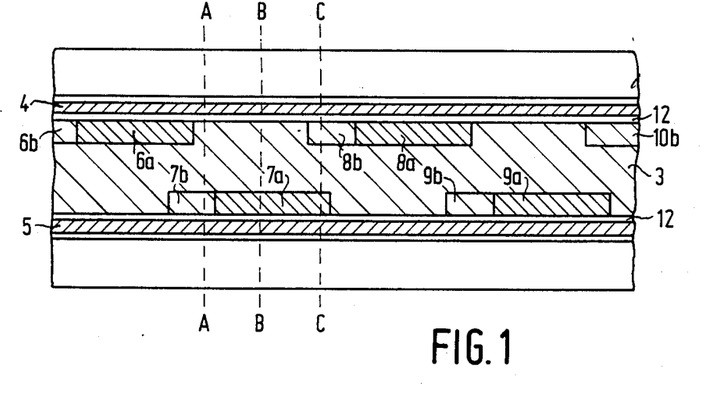
FIG. 1 is a plan view of a part of a first embodiment of a ccd according to the invention.
Figure 2:
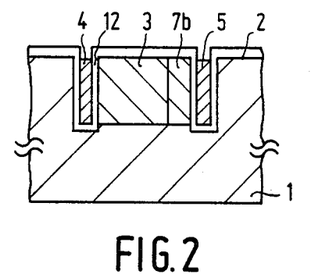
FIGS. 2 to 4 show a few sectional views of the device shown in FIG. 1 taken on the lines A—A, B—B and C—C, respectively.

The first embodiment relates to a single ccd line, which may be used, for example, as a delay line for signals to be introduced electronically. FIG. 1 shows in plan view a part of this device. The input stage and the output stage are not shown in the Figure. The device is provided in a semiconductor body 1, for example of silicon, at whose surface 2 the charge transport channel 3 is defined. Through this charge transport channel, information-representing charge packets can be transported via an input situated at the lefthand end from the left to the right to an output situated at the right-hand end. The charge transport takes place under the influence of control voltages applied to two electrodes 4 and 5, which are constituted by two strip-shaped conductors extending parallel to each other from the left to the right throughout the length of the part of the charge transport device shown in FIG. 1. Doped regions 6–10 are provided in the semiconductor layer 3 in such a manner that, when alternating voltages are applied between the electrodes 4 and 5, charge packets are transported from the left to the right via the regions 6–10, which comprise charge storage and are situated alternately near the electrode 4 and near the electrode 5. The regions 6–10 are divided into a section a and a section b, which will be described more fully hereinafter.

According to the invention, the first electrode 4, the charge transport channel 3 and the second electrode 5 constitute a multilayer structure, the charge transport channel being located between the electrodes 4 and 5, which are provided on two opposite sides of the charge transport channel. In the present embodiment, in which the electrodes 4 and 5 are insulated by a thin oxide layer 12 from the charge transport channel, the electrodes 4, 5 constitute with the oxide layer 12 and the charge transport channel 3 a five-layer configuration. However, embodiments are also possible in which the electrodes 4, 5 are separated by a rectifying junction, for example a Schottky junction, from the charge transport channel and constitute with the charge transport channel a three-layer configuration. Viewed in the direction from the electrode 4 to the second electrode 5, the charge transport channel 3 has a thickness and a doping concentration such that, when a voltage is applied between the electrodes 4 and 5, an electric field can be induced in the charge transport channel transversely through its thickness without breakdown.

In the present embodiment, the charge transport channel 3 has a mesa-like configuration, in which the electrodes 4, 5 are provided at the upright walls of the mesa. This mesa can be obtained, for example, by local epitaxy on a suitable substrate. However, in the embodiment shown here, the mesa is obtained in that, starting from a silicon body 1 having a flat upper surface 2, grooves are etched on either side of the charge transport channel, which limit the charge transport channel 3 in the longitudinal direction and in which the electrodes 4, 5 are provided.

The charge transport channel 3 comprises a semiconductor layer having a substantially uniform low doping concentration of a given type, in the present embodiment of the n-type. The zones 6–10 provided at the sides of the mesa comprises a part a constituting a charge storage region and a part b constituting a charge transfer region. As appears from FIG. 1, the zones 6–10 are arranged zigzagwise from the left to the right in such a manner that even-numbered zones are situated near the electrode 4 and define near the electrode 4 a series of storage sites. The odd-numbered zones are associated with the electrode 5 and define a series of storage sites near the electrode 5. Subzones a and b are of the same conductivity type, for example of the n-type, for a charge-coupled device of the n-channel type, the doping concentration of the charge storage parts a being higher than that of the charge transfer parts b. The zones 6–10 are mutually separated by intermediate parts of the charge transport channel 3 having a comparatively low doping concentration. The conductivity type of the layer 3 may also be the p-type for an n-channel device. In this case, the charge transfer parts may also be constituted by p-type zones. However, the layer 3 is preferably also of the n-type having a doping concentration lying again below that of the subzones b of the zones 6–10. In order to obtain a good charge transport and to obtain a configuration as compact as possible, viewed in a direction transverse to the side faces, the storage regions a of a preceding stage overlap the transfer regions b of a succeeding stage. However, this overlap is not necessary.

It should be noted that the zones 6–10 may be constituted instead of by shallow zones also by zones or regions having a gradually varying doping concentration, which extend transversely across the thickness of the semiconductor layer in such a manner that the point of gravity of the doping lies in the zones a and b.

Figure 5A:
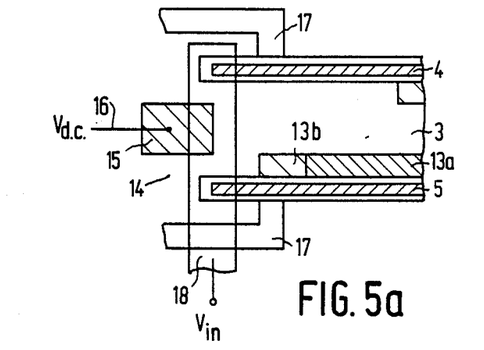
FIG. 5a is a plan view of the input part and FIG. 5b of the output part of the device shown in FIG. 1.

FIG. 5a is a diagrammatic plan view of a possible input stage of the device. The clock electrodes 4 and 5 terminate with the grooves in which they are provided in a widened part 14 of the channel 3. In the widened part is provided an n+ zone 15, which constitutes the input diode and to which a suitably chosen direct voltage can be applied via the connection 16 shown diagrammatically. The region is limited in the semiconductor body by an annular region 17, which insulates the region 14 from surrounding parts of the semiconductor body and which is constituted, for example, by a p± zone, but may alternately be constituted, for example, by an oxide pattern or by a groove.

Between the zone 15 and the charge transport channel 3 is provided an insulated gate electrode 18, which constitutes an input gate to which an input signal $V_{in}$ can be applied. The input signal $V_{in}$ may be, for example, digital information and may determine whether a charge packet can flow or cannot flow into the first storage region 13. The input signal $V_{in}$ may of course also be analogue.

Figure 5B:
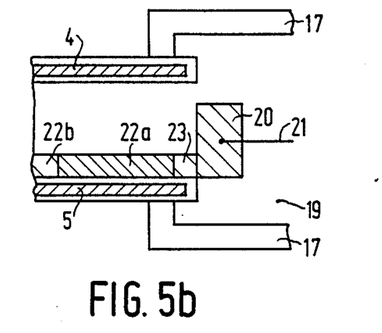

FIG. 5b is a diagrammatic plan view of a possible embodiment of the output stage. The charge transport channel terminates in a widened part 19, which is defined again in the semiconductor body be a p+ ring 17. In the region 19 is provided an output diode 20, which may be connected via the connection 21 to an amplifier and, if desired, to a reset transistor. Between the n+ zone 20 and the last storage region of the channel 3, indicated by 22a, an n-type zone 23 is provided, whose doping concentration is equal to or higher than that of the part 22a, but is so low that during operation the channel 3 can be depleted throughout the width between the electrodes 4, 5 at the area of the zone 23. Due to the higher doping of the zone 23, the potential minimum (for electrons) will be higher in the zone 23 than in the storage region 22a so that signal charge arriving at the region 22a will flow directly via the zone 23 to the output diode 20.

The device described here can be manufactured by techniques known per se. With reference to FIG. 6, a manufacturing method will be described which offers particular advantages and which is the subject matter of Netherlands Patent Application 8502765 in the name of the Applicant. FIG. 6 shows the device in a sectional view taken on the line B—B in FIG. 1 at a few stages of the manufacture.

The starting material is a p-type semiconductor body 1 of silicon, whose surface 2 coincides with the <100> crystal surface. By means of ion implantation, the n-type charge transport channel 3 can be formed, while at the same time the n-type regions 14, 19 are provided at the input and the output, respectively. On behalf of the grooves limiting the charge transport channel 3, the surface 2 is provided with an etching mask comprising an oxide layer 25 (FIG. 6a) having a thickness of about 0.5 $\mu$m. By anisotropic etching, the grooves 26, 27 can be formed.

Figure 6A:
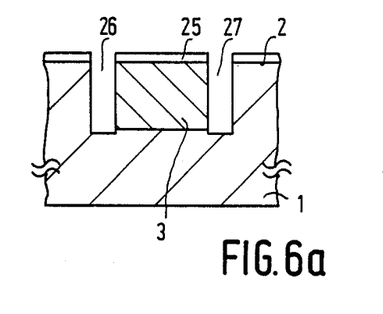
FIGS. 6a–6d shows the device at a few stages of its manufacture.
Figure 6B:
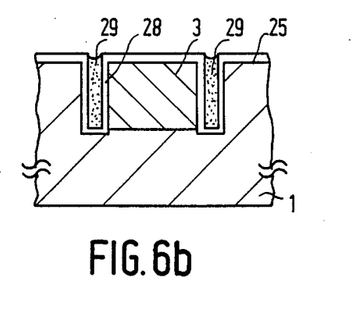
Figure 6C:
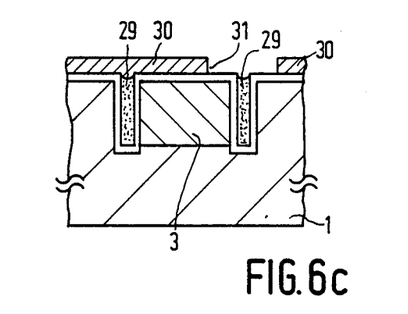
Figure 6D:
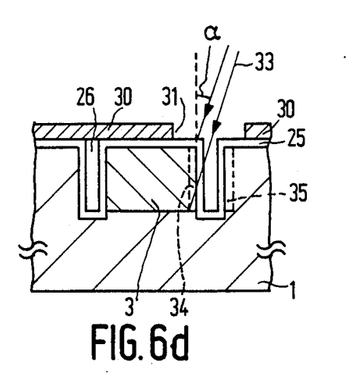

In a next step (FIG. 6b), the walls of the grooves 26, 27 are covered with a comparatively thin oxide layer 28 having a thickness of 20–30 nm. Subsequently, in known manner, the grooves are filled by planarization with a filler material, more particularly with a photoresist layer 29. An implantation mask 30 can be formed on the upper surface thus planarized and this mask has a window 31 at the areas at which the storage region 7a is formed (FIG. 6c). For the mask 30 use may be made of a layer of a suitable metal, for example Al, but other materials may also be advantageously employed.

After the mask 30 has been provided, the photoresist layer 29 can be entirely removed (FIG. 6d), as a result of which the walls of the grooves are exposed for doping. In the next step, P or As atoms are provided in the wall of the groove 27 by implantation—indicated by lines 33—of ions at a suitable angle. The value of the angle $\alpha$ can be chosen in a simple manner by a person skilled in the art in dependence upon the depth and the width of the groove. The wall of the groove is doped only at the area of the window 31 in the mask 30. At the area at which the groove (for example the groove 26 in FIG. 6d) is covered by the Al layer 30, the implantation is stopped. On the part of the flat surface 2 which is not covered by the masking layer 30 the ions are stopped by the thick oxide layer 25. The thickness of the oxide layer 28 on the walls of the grooves is so small that the ions can pass substantially without hindrance.

Figures 3, 4:
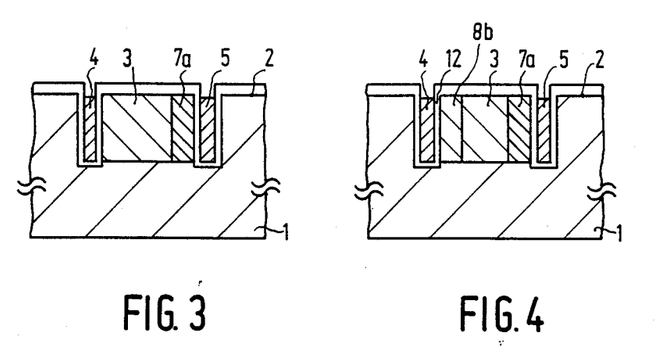

At the wall of the groove there is obtained in the channel 3 a doped zone 34 from which, as the case may be after heating, the storage region 9a can be formed as is shown in FIG. 3. In a corresponding manner, at the same time the corresponding remaining storage regions are provided near the groove 27. The corresponding zones 6a, 8a, 10a at the wall of the groove 26 can be provided in a second implantation step, in which the ion beam 33 and the semiconductor body 1 are rotated with respect to each other through an angle of 180°. A separate mask 30 can then be used. However, the mask windows defining the zones 6a,7a,8a,9a etc. on either side of the channel 3 are preferably defined in a common mask 30, as a result of which the number of manufacturing steps remains limited. Similar zones 35, indicated by dotted lines in FIG. 6d, can be formed in the other walls of the grooves 26,27 adjoining the nonactive parts of the semiconductor body 1. In a number of embodiments, for example in the case of adjacent parallel channels, storage regions can be obtained in this manner in adjacent channels by means of each time one window. In embodiments in which the parts of the semiconductor body surrounding the channel 3 constitute active regions of a circuit in which transistors are to be provided and in which the zones 35 are not desired, the process can be carried out by means of two doping masks.

In a manner analogous to that described here for the zones 6a,7a,8a etc., the zones 6b,7b,8b etc. can be provided.

The remaining components can be provided in a conventional well known manner.

In a particular embodiment, the channel 3 had a thickness of about 3 $\mu$m and a width (distance between the grooves 26 and 27) of about 4 μm. The average doping concentration was about $10^{15}$ atoms per $cm^3$. The thickness of the zones 6-10, 13 and 22 was about 0.2 μm. The doping concentration of the parts a in which the charge is stored was about 4 to $6.10^{16}$ atoms per $cm^3$. The doping concentration of the parts b was about $3.10^{16}$ atoms per $cm^3$. The lengths of the parts a and b were about 3.0 μm and 1.5 μm, respectively. The distance between the zones 6,8,10 etc. on one side of the channel and the distances between the zones 7,9 etc. on the opposite side of the channel 3 are about 4.0 μm.

Figure 7:
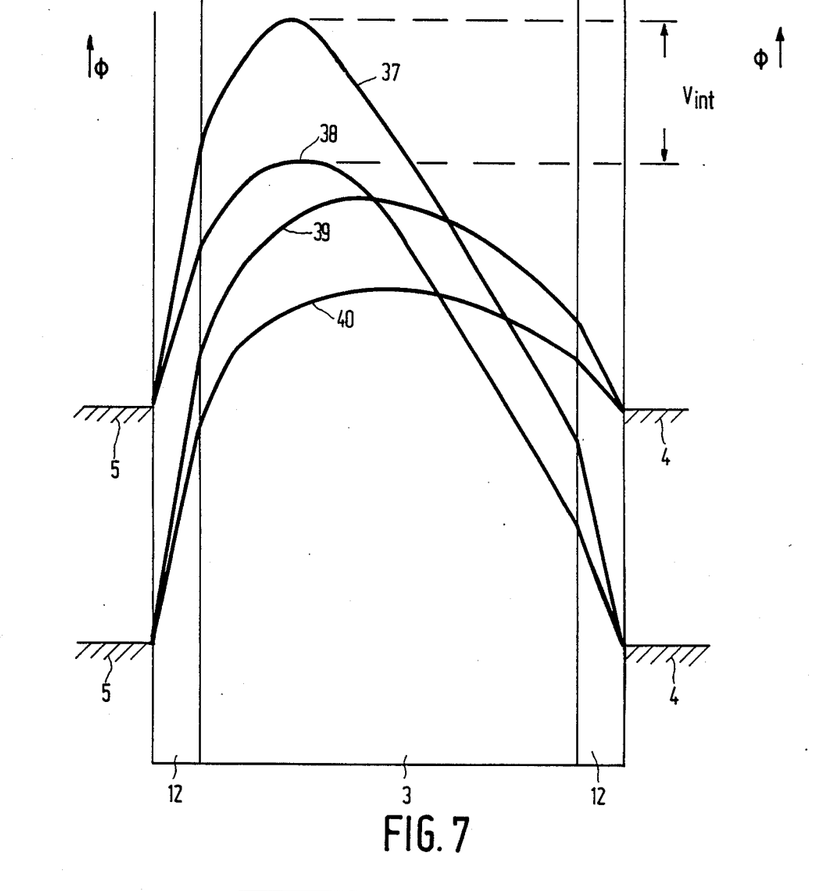
FIG. 7 shows a few potential distributions in the device shown in FIG. 1 during operation.
Figure 8:
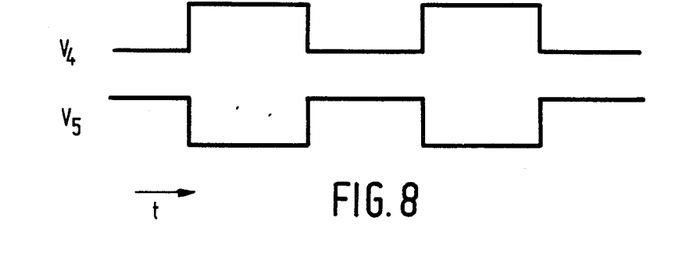
FIG. 8 shows clock voltages $V_4$ and $V_5$, which can be applied during operation to the device shown in FIG. 1, as a function of the time t.

During operation, the clock voltages $V_4$ and $V_5$ varying between a level of, for example, +10 V and a low level of 0 V and shown in FIG. 8 as a function of the time t are applied to the clock electrodes 4,5. The voltages $V_4$ and $V_5$ both vary in the embodiment shown in FIG. 8. However, it will be appreciated that alternatively one of the two voltages may be kept constant at a given level and the other voltage then lies above this level at a high voltage and lies below this level at the low voltage. The output voltage lies, for example, at +15 V. FIG. 7 shows the potential diagram in the channel 3 along the lines BB and AA in FIG. 1 at these clock voltages. It is assumed that the charge transport channel 3 is depleted throughout its thickness at the applied voltages. The electrodes 4,5 and the oxide layers 12 are shown diagrammatically.

The curves 37 and 38 represent the potential distribution over the channel 3 if the high voltage level (10 V) is applied to the clock electrode 5 and the low clock voltage level (0V) is applied to the clock electrode 4 along lines BB and AA, respectively, in FIG. 1. The potential curve 37 shows a potential maximum close to the oxide layer 12 in which electrons can be stored. The curve 38 shows a maximum which is lower than the maximum of the curve 37 due to the lower doping concentration in the subzones b. Electrons stored in the maximum of the curve 37 cannot flow back to one of the adjacent storage regions on the same side of the channel 3 due to the potential barrier of the curve 38. The maximum quantity of charge that can be stored is determined by the potential difference $V_{int}$, which is equal to the difference between the potential maximum of the curves 37 and 38.

It should be noted that in FIG. 7 the potential limitation of the storage region 7a is shown only on the lefthand side, i.e. at the subzone 7b represented by the curve 38. The limitation on the righthand side between the zones 7a and 9a (cf. FIG. 1) is analogous to the curves 39 and 40, as will appear below. The potential barrier which is obtained if in this situation the potential distribution is considered at an area between the zones 7a and 9a will be at any rate higher than the potential barrier formed by the curve 38 due to the low doping concentration of the channel 3.

The curves 39 and 40 show the potential distributions along the lines B—B and A—A, respectively, in the case in which the voltage 0 V is applied to the electrode 5 and the voltage 10 V is applied to the electrode 4. Due to the lower voltage at the electrode 5, the potential in the zones 7a and 7b is strongly reduced, while in the adjoining low-doped parts of the channel 3 in which the potential is strongly determined by the voltage at the electrode 4 the potential increases. The electrons stored in the zone 7a (with the potential maximum of the curve 37) are now transferred to the region 8a on the other side of the channel 3, on which the potential now is a maximum.

When therefore the electrodes 4 and 5 are clocked with the clock voltages $V_4$ and $V_5$, the charge is transported back and forth between the sides of the channel 3 to the output of the device.

The device described here has great advantages with respect to charge-coupled devices of known types. Due to the fact that no overlap is required between the clock electrodes 4, 5 the parasitic capacitance between the electrodes and hence also the power dissipation for the control of the device is low. Due to the fact that the dynamic range of the device is also determined by the depth of the grooves and is not determined, as in a conventional ccd, by the width of the channel, the charge transport channel can be very narrow and can occupy little space. Moreover, the upper surface of the charge transport channel can be kept free from electrodes, which is advantageous with the use as a sensor for electromagnetic radiation.

Figure 9:
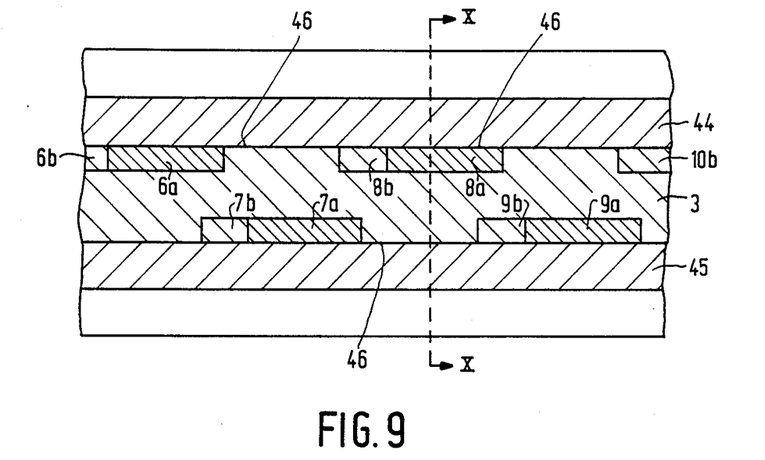
FIG. 9 is a plan view of a part of a second embodiment of a ccd according to the invention.

FIG. 9 shows in plan view a variation of the charge-coupled device shown in FIG. 1. This variation mainly differs only from the configuration of FIG. 1 in that instead of insulated electrodes 4, 5 now clock electrodes 44, 45 are used in the form of elongate p-type zones which are separated from the charge transport channel by a rectifying pn junction 46.

Figure 10:
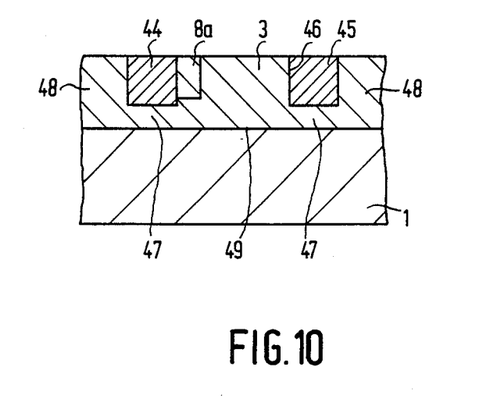
FIG. 10 is a sectional view of the device shown in FIG. 9 taken on the line X—X.

FIG. 10 is a diagrammatic sectional view taken on the line X—X. The device comprises a p-type substrate 1, on which the n-type charge transport channel 3 is formed by means of epitaxy or by means of ion implantation. The clock electrodes 44, 45 are entirely surrounded by n-type material in the semiconductor body and are insulated from the p-type substrate 1 by interposed n-type regions 47. During operation, the channel 3 can be insulated from the n-type regions 48 located at the outer edge by cutting off the pn junction 46 and the pn junction 49 between the substrate 1 and the n-type channel region 3, as a result of which conduction via the regions 47 between the channel 3 and the regions 48 is avoided.

The device can be operated in a manner similar to that in which the device shown in FIG. 1 is operated, the clock electrodes 44, 45 and the channel 3 being biased with respect to each other in such a manner that the pn junctions 46 remain cut off.

In the embodiment shown here, the preferred regions 6-10 are situated in the plane of the charge transport channel. However, in another embodiment, these regions may also be situated in the plane of the p-type electrodes 44, 45.

Figure 11:
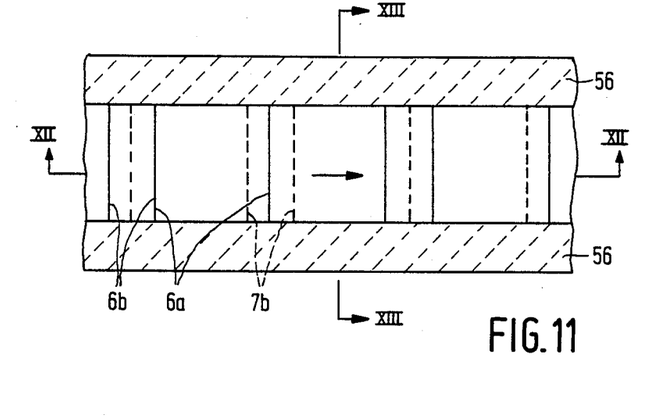
FIG. 11 is a plan view of a third embodiment of a ccd according to the invention.
Figure 12:
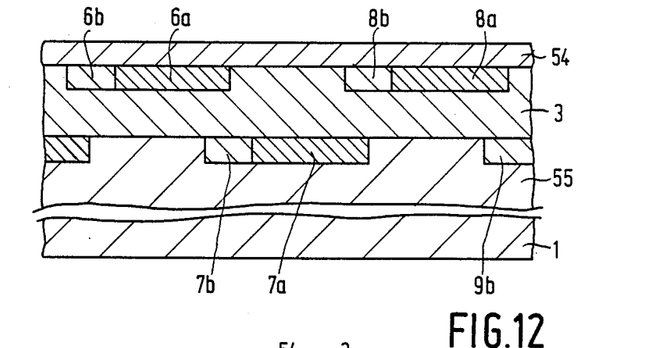
FIG. 12 is a sectional view of this device taken on the line XII—XII in FIG. 11.
Figure 13:
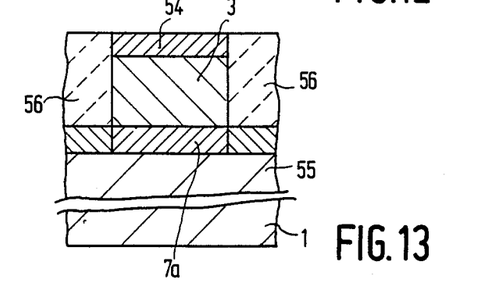
FIG. 13 is a sectional view of the same device taken on the line XIII—XIII in FIG. 11.

In the embodiments described so far, the electrodes were provided at the sides of mesa-shaped channels, the charge transport from one storage region to the next storage region taking place mainly parallel to the upper surface. FIG. 11, 12 and 13 are a plan view and two sectional views of an embodiment, in which the electrodes are situated on the upper side and on the lower side of the channel 3 and which the transport from one storage region to a next storage region comprises movement transverse to the upper surface. The device again comprises a p-type silicon substrate 1 which is provided on the upper side with the n-type charge transport channel 3. The charge storage regions 6a, 7a, 8a etc. and transfer regions 6b, 7b, 8b, 9b are situated alternately on the upper side and on the lower side of the layer 3. One clock electrode is constituted by an elongate p-type surface zone 54 on the upper side of the device. The other clock electrode comprises the p-type region 55 which adjoins the lower side of the n-type channel 3. In the present embodiment, the region 55 forms part of the p-type substrate and therefore is supplied with a fixed potential during operation. However, it is alternatively possible for the p-region 55 to be separated by a pn junction from the subjacent part of the substrate, and connected to a source of alternating voltage. The channel 3 is laterally limited by insulation regions 56, which in this case comprise silicon oxide, but which may of course also be composed of other suitable materials or may be grooves. Below the insulation regions 56 p-type channel stopper regions 57 may be provided, whose doping is slightly higher than the background concentration of the p-type body 1.

During operation, a fixed voltage $V_{55}$ is applied to the p-type region 55 in such a manner that the pn junction between the region 55 and the n-type channel 3 is constantly cut off. An alternating voltage having a highest level exceeding the voltage $V_{55}$ (at which the pn junction between the layer 54 and the layer 3 should remain cut off) and a lowest level lying below the level $V_{55}$ is applied to the clock electrode 54. At the high voltage level, the charge packets are stored in the storage regions 6a, 8a etc. adjoining the electrode 54. At the low voltage level at the electrode 54, the charge packets are stored in the storage regions 7a, 9a etc. adjoining the region 55.

The device can be manufactured by means of techniques known per se. There can be started from a p-type substrate, which is provided, either by thermal oxidation or by deposition, with an oxide layer having a thickness equal to that of the insulation regions 56 to be formed. By means of photo-masking and etching, the insulation regions 56 can be formed from this oxide layer, the substrate 1 being exposed at least at the area of the charge transport channel 3 to be formed. By means of implantation, the n-type zones 7b, 7a; 9b, 9a etc. can be provided in the substrate 1, after which the n-type charge transport channel 3 is formed, for example by means of selective epitaxy, the thickness of the epitaxial layer corresponding to the height of the insulation regions 56. In a next step, the n-type regions 6b, 6a; 8b, 8a etc. and the p-type electrode 54 can be provided at the surface of the epitaxial layer, whereupon the surface can be covered in the usual manner by a passivating layer and the device can be subjected to further usual processing steps, such as providing the wiring.

Of course other known techniques may also be used. For example, after the n-type zones 7b, 7a, 9b, 9a etc. have been provided in the substrate, an n-type epitaxial layer may be grown on the substrate. At the area of the insulation regions 56, grooves may be etched therein, which are then closed again by oxidation.

Figure 14:
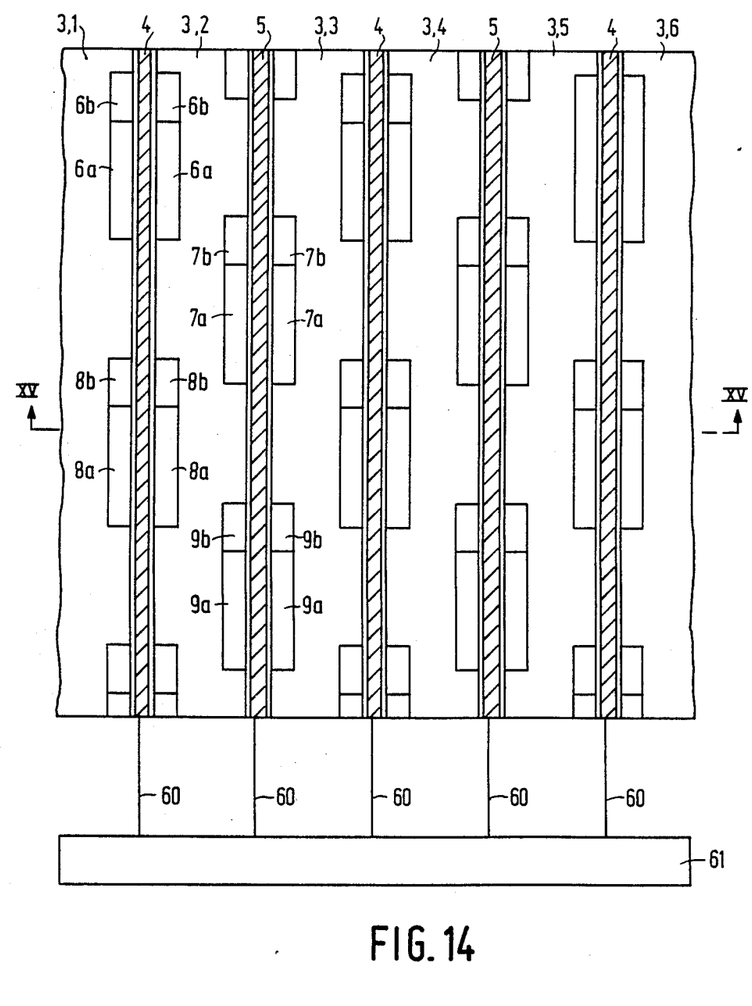
FIG. 14 is a plan view of a part of an image sensor device according to the invention.

FIG. 14 is a plan view of a bidimensional system composed of charge-coupled devices as shown in FIG. 1. The device comprises a plurality of adjacent parallel channels 3, which, in order to distinguish them from each other, are provided with the reference numerals 3,1; 3,2; 3,3 etc. In the drawing, only six channels are shown; however, actually the number may be many hundreds, in dependence upon the application. In the charge transport channels 3, charge transport regions and charge storage regions 6,7,8,9 are provided in such a manner that the transport in the channels 3 takes place in the plane of the drawing from the upper to the lower side. The channels 3 are laterally limited by grooves, in which, like in the first embodiment, clock electrodes 4, 5 are provided. It should be noted that each of the electrodes shown is associated with two adjacent transport channels 3. The electrodes 4,5 are connected through the connections 60 shown diagrammatically to a voltage source 61.

The voltages supplied by the voltage source 61 depend upon the kind of application of the device. In the case, for example, in which the device forms part of a parallel part of a memory matrix having an SPS (Series/Parallel/Series) configuration, usual two-phase clock voltages can be applied to the electrodes 4,5.

An important field of application of the structure shown in FIG. 14 is formed by image sensor devices, in which an electromagnetic radiation image projected onto the surface is converted into a corresponding pattern of charge packets. In comparison with conventional charge-coupled image sensors, the device shown here according to the invention affords the advantage of a particularly high sensitivity to light of shorter wavelength (blue) because the photosensitive surface is not covered, as in conventional devices, by clock electrodes, which, even if they are made of a transparent material, such as polycrystalline silicon, nevertheless absorb a part of the incident radiation, generally shortwave light more strongly than long-wave light.

The image sensors may be, for example, of the frame transfer (often abbreviated as FT) type, in which event the matrix is composed of two parts to be distinguished, i.e. the image sensor section and the memory section which is aligned thereto and is screened from the incident light by a reflecting layer. During operation, the principle of interlacing may advantageously be used, for example in that, when a first frame is sensed, the electrodes 4 are used as an integrating gate and the electrodes 5 are used as an integrating gate when the next subsequent frame is sensed.

The sensor may alternatively be advantageously of the line transfer type, in which event the drawing should be assumed to be rotated through 90° in such a manner that a charge transport channel extends in the horizontal direction corresponding to the horizontal lines of conventional display devices. This known type of sensor devices has, for example, with respect to the sensor devices described above of the FT type the advantage that no memory is required because now the channels can be read successively and after reading such a device is immediately ready again for sensing the next frame.

If during operation the information stored, for example, in the ccd channel 3,3 should be read, clock voltages may be applied to the electrodes 4 and 5 associated with the channel 3,3, as is represented, for example, in FIG. 8. Since the charges stored in the remaining ccd channels must not be transported, the remaining clock electrodes are kept at a direct voltage level. This voltage level should be chosen so that the charge packets in the channels 3,2 and 3,4 which each have a clock electrode in common with the channel 3, 3 must not be transported. Such a situation can be obtained by choosing for the said direct voltage a voltage level which lies above the high level of $V_4$ and $V_5$ or a voltage level which is lower than the lower voltage level of $V_4$ and $V_5$. An advantageous mode of operation consists in that in one frame a high direct voltage is applied to the clock electrodes 4 and the low direct voltage is applied to the clock electrodes 5, as a result of which in this frame the points of gravity of the pixels are located in the storage regions 6a, 8a opposite to the clock electrodes 4. In the next frame, these voltages can be inverted, as a result of which in the second frame the points of gravity of the pixels are located opposite to the clock electrodes 5 in the storage regions 7a, 9a etc. Since the pixels in the first and the second frame are shifted with respect to each other over a distance of half a pixel, a quasi doubling of the pixel density can thus be obtained.

This mode of operation can also be used in the case in which the part of the sensor shown in FIG. 14 forms part of an FT sensor, in which event the two frames correspond to the two frames consisting of the even-numbered lines and the odd-numbered lines, respectively, of an image sensor device.

Figure 15A:
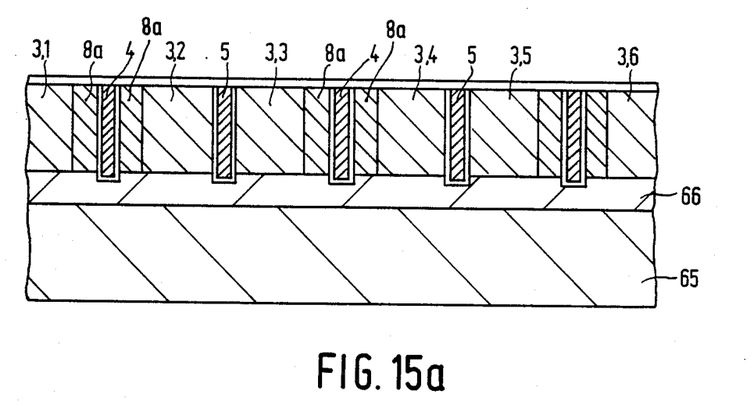
FIG. 15 is a sectional view of the device shown in FIG. 14 taken on the line XV—XV in two different constructions.
Figure 15B:
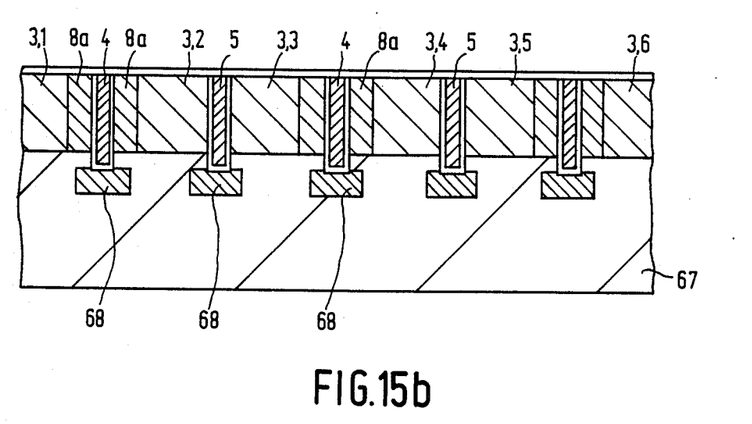

The sensor may be protected from "blooming" in many known ways. The term "blooming" designates the phenomenon that due to local over-exposure charge carriers spread over a part of a whole line. An anti-blooming technique, which offers particular advantages in the sensor described here, is the vertical anti-blooming also known per se, in which the excess of charge carriers due to local over-exposure is drained via a zone located below the photosensitive region, for example the substrate. Such a vertical anti-blooming used in charge-coupled image sensors of the frame transfer type (FT type) is described inter alia in Netherlands Patent Application 8304035(PHN.10855) in the name of the Applicant. In this case, several embodiments are possible again, as shown in FIG. 15a and b. These Figures show a sectional view taken on the line XV—XV in FIG. 14 of two possible embodiments of the device shown in FIG. 14 with vertical anti-blooming. In the embodiment shown in FIG. 15a, the carrier body on which the device is provided is constituted not by a p-type substrate, but by an n-type substrate 65. A comparatively thin p-type layer 66 is provided between the substrate 65 and the n-type charge transport channels 3. The thickness and the doping concentration of the layer 66 are chosen so that, when suitable voltages are applied, the layer 66 can be depleted throughout its thickness. During operation, the layer 66 will form a potential barrier between the charge storage regions 7a, 8a etc. in the channels 3 and the substrate 65, which is slightly lower than the potential barriers between the storage regions. Due to over-exposure, the (negative) potential level in the charge storage regions can increase to such an extent that electrons flow over the barrier into the substrate 65 and can be drained there instead of spreading over the relevant ccd channel.

FIG. 15b shows an embodiment in which the carrier body is constituted by a p-type substrate 67, in which buried n-type zones 68 are formed, which are located below the electrodes 4,5 and below the charge storage regions 7a, 8a etc. and which are separated from the charge storage regions by intermediate parts of the p-type substrate 67. The operation of the device shown in FIG. 15b is identical to that of the device shown in FIG. 15a. The device shown in FIG. 15b had inter alia the advantage, however, that the n+ zones can be formed by implantation via the grooves 26, 27, in which the electrodes 4,5 are provided.

Figure 16:
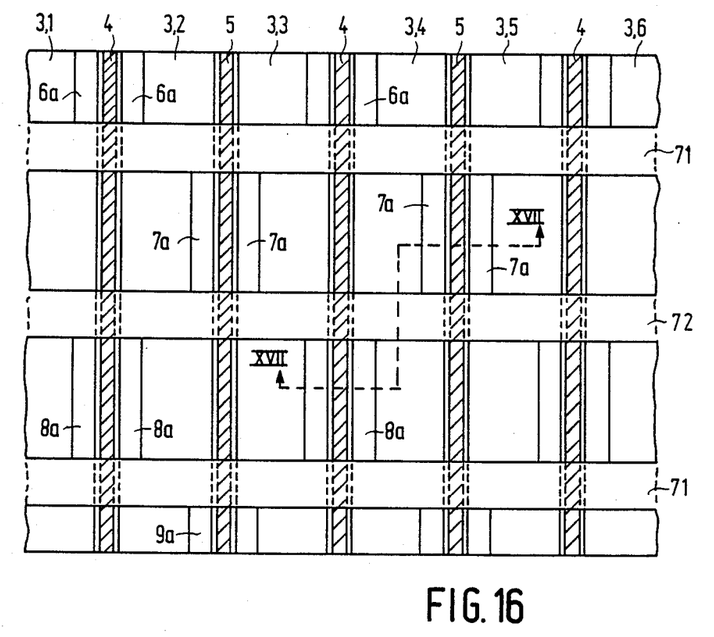
FIG. 16 is a plan view of a part of a further embodiment of a ccd according to the invention.
Figure 17:
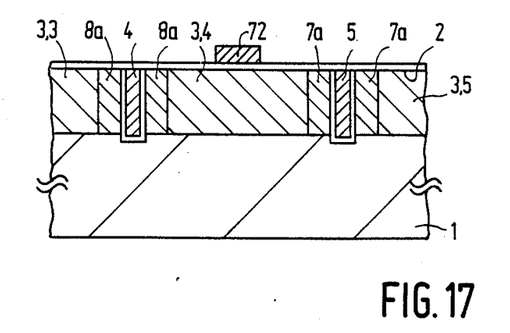
FIG. 17 is a sectional view of this device taken on the line XVII—XVII.

FIGS. 16 and 17 show in plan view and in sectional view, respectively, a further variation of a device according to the invention, which is distinguished more particularly from the devices described so far in that the doped charge storage regions are constituted only be the subzones a and therefore by the zones 6a, 7a, 8a, 9a etc. The subzones b are replaced by the clock electrodes 71, 72, which extend in FIG. 15 from the left to the right at right angles to the main transport direction in the channels 3 over the surface 2.

The device shown in FIGS. 16, 17 may also form a part of an image sensor device, just like the device shown in FIG. 14. The device may be operated as a four-phase ccd, in which event the electrodes 4 and 5 are driven by the clocks $\phi_1$ and $\phi_3$ and the electrodes 71, 72 are driven by the clocks $\phi_2$ and $\phi_4$. A charge packet may first be stored, for example, in a charge storage region 6a near the electrode 4, then stored below a clock electrode 71, and then transferred to a storage region 7a near the clock electrode 5. It is then stored at a next stage below the clock electrode 72.

The device may also be operated as a four-phase quasi two-phase device, in which event the clock electrodes 71, 72 only act as transfer gates and the charge packets are directly transferred from 6a to 7a, from 7a to 8a etc.

The electrodes 71, 72 may alternately be connected to the common clock line. The width of the tracks 71, 72 is preferably kept small with respect to their relative distances so that between the electrodes 71 and 72 windows are formed which are not covered by electrode material, as a result of which the photosensitivity remains high.

It will be appreciated that the invention is not limited to the embodiments shown here, but that within the scope of the invention many further variations are possible for those skilled in the art. For example, in the device shown in FIG. 15a, the grooves may extend transversely across the p-type layer 66 to the substrate 65, where the anti-blooming level can be adjusted in a simple manner with the vertical MOS transistors thus formed. In the embodiment shown in FIGS. 9 and 10, the whole semiconductor body may be of the n type. The clock electrodes 44, 45 are then insulated from each other by this n-type material. The charge transport region may be insulated from the substrate of the same conductivity type by a suitable choice of the substrate voltage, as a result of which electric fields are induced from the electrodes 44,45 in the substrate, which fields separate the charge transport region on the lower side from the substrate.

What is claimed is:

1. A charge-coupled semiconductor device comprising:

a charge transport channel at a major surface of a semiconductor body and in which discrete charge packets can be transported in successive steps from a first position at one end of the channel to a second position at the other end thereof, such channel having regions therein for storing such discrete charge packets; and electrodes adjacent such storage regions for transferring charge packets from said first position to said second position in response to alternating control voltages applied to such electrodes;

characterized in that:

said electrodes consist of first and second continuous elongated conductive strips coextensively disposed on opposite sides of the charge transport channel and extending along a plurality of storage regions;

said storage regions in the charge transport channel are progressively situated on opposite sides of such channel between said first position and said second position, and extend transversely into said channel to a depth less than half the thickness thereof, thereby leaving a central region of said channel unobstructed between said first position and said second position; and the charge transport channel has a thickness and doping concentration such that when said alternating control voltages are applied to said electrodes and electrical field is produced in said transport channel in a direction from said first position to said second position.

2. A charge-coupled device as claimed in claim 1, characterized in that, viewed in section transverse to the charge transport direction, the charge transport channel has a mesa configuration with upright side walls, and in that said first and second electrodes are respectively adjacent the respective upright wall of the mesa.

3. A charge-coupled device as in claim 2, characterized in that the mesa is limited in the semiconductor body by two grooves which are provided in the semiconductor body on either side of the charge transport channel, said first and second electrodes respectively being positioned in the respective grooves.

4. A charge-coupled device as claimed in claim 3, characterized in that the walls of said mesa forming the charge transport channel are covered by a gate dielectric which separates the first and second electrodes provided in the grooves from the charge transport channel.

5. A charge-coupled device as claimed in any one of the preceding Claims, characterized in that the charge transport channel comprises a layer of substantially uniform doping concentration and a row of zones of a first conductivity type progressively positioned zigzagwise on opposite sides of such layer between the first and the second position, said zones being alternately connected to alternate ones of said electrodes and being mutually separated by parts of said layer of substantially uniform doping concentration, each of said zones having a charge transfer part thereof of comparatively low doping concentration and an adjoining charge storage part thereof of comparatively high doping concentration.

6. A charge coupled device as claimed in claim 5, characterized in that the charge storage part of each zone on one side of said layer and the charge transfer part of each succeeding zone on the other side of said layer partially overlap each other as viewed in a direction transverse to the sides of said layer.

7. A charge-coupled device as claimed in claim 5, characterized in that said layer of substantially uniform doping concentration is of said first conductivity type and has a lower doping concentration than the charge transfer parts of the said zones.

8. A charge-coupled device as claimed in claim 3, characterized in that the device further comprises at least a second charge transport channel beside and parallel to the first-mentioned charge transport channel, the second channel being of substantially the same construction as the first-mentioned channel and having an electrode which is common to both said channels.

9. A charge-coupled device as claimed in claim 8, characterized in that the device comprises a plurality of adjacent parallel charge transport channels which are mutually separated by grooves each of which is filled with a common electrode, all of said channels being of substantially the same construction and forming a matrix of photosensitive elements of a bi-dimensional image sensor device.

* * * * *